(12) United States Patent
Gilliland et al.

(10) Patent No.: US 6,349,105 B1
(45) Date of Patent: Feb. 19, 2002

(54) SMALL FORMAT OPTICAL SUBASSEMBLY

(75) Inventors: Patrick B. Gilliland, Chicago; Carlos Jines, Forest Park; Theodore Washburn, Barrington; Scott Erickson, Bartlett; Gregg Rapala, Arlington Heights, all of IL (US)

(73) Assignee: Stratos Lightwave, Inc., Chicago, IL (US)

( * ) Notice: Subject to any disclaimer, the term of this patent is extended or adjusted under 35 U.S.C. 154(b) by 48 days.

(21) Appl. No.: 09/584,455

(22) Filed: May 31, 2000

Related U.S. Application Data

(63) Continuation-in-part of application No. 09/545,087, filed on Apr. 7, 2000.

(51) Int. Cl.$^7$ .............................................. H01S 3/19
(52) U.S. Cl. ...................................................... 372/50
(58) Field of Search .......................................... 372/50

(56) References Cited

U.S. PATENT DOCUMENTS

| | | | |
|---|---|---|---|
| 5,812,582 A | * 9/1998 | Gilliland et al. | 372/50 |
| 5,815,623 A | 9/1998 | Gilliland et al. | 385/93 |
| 5,938,952 A | 8/1999 | Lin et al. | 219/121.64 |
| 6,005,276 A | 12/1999 | Forrest et al. | 257/432 |
| 6,014,476 A | 1/2000 | Meyer-Guldner et al. | 385/14 |

OTHER PUBLICATIONS

Data Sheet—MLC–25–4–X–TL Optical Gigabit Ethernet—+3.3V (10 pages), Methodl Electronics, Inc., Optoelectronic Products.

Data Sheet—Preliminary Technical Specification of 1.3um MQW–FP Laser Diode Module; (Transmitter Optical Subssembly) SLT2160–LN Series, Sumitomo Electric Industries, Ltd., (6 pages)— Oct. 5, 1999.

Drawing No. 230–019, "1300 nm Laser Diode MTS," Methode Electronic,Inc., Jan. 25, 1999.

Photocopy of photograph of Methode Electronics,Inc.'s 1300 nm Laser Diode MTS.

* cited by examiner

*Primary Examiner*—Leon Scott, Jr.
(74) *Attorney, Agent, or Firm*—Karl D. Kovach

(57) ABSTRACT

A small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an optical diode, and conductors between the electrically conductive can and the non-electrically conductive substrate. The non-electrically conductive substrate has two through-holes formed through a thickness of the non-electrically conductive substrate. The two through-holes are filled with an electrically conductive material so as to form two electrically conductive vias. Additionally, a surface of the non-electrically conductive substrate is organized into two regions. The first region has the electrically conductive plating material applied thereto. The first and second through-holes protrudes through the second region. The optical diode has a first lead electrically connected to the first via, and the optical diode has a second lead electrically connected to the second via.

14 Claims, 19 Drawing Sheets

SMALL FORMAT OPTICAL SUBASSEMBLY

This application is a continuation-in-part of U.S. Ser. No. 09/545,087, filed Apr. 7, 2000. The aforementioned parent application is hereby incorporated herein by reference.

BACKGROUND OF THE INVENTION

1. Field of the Invention

The present invention pertains to optoelectronic devices or optical subassemblies. The invention more particularly concerns a small format optoelectronic package.

2. Discussion of the Background

Optoelectronic devices such as optical transceivers are known in the art and include active optical devices or diode packages. Common diode packages include LED packages such as a TO-46 package or a 5.6 mm TO style laser diode package such as an RLD-85PC diode package by Rohm, Incorporated. These diode packages or TO cans typically include a metallic housing having a laser diode or LED for transmitting data and a photo diode for performing power-monitoring, metal contact leads exiting from the diodes for connection to a power source and a cover glass opposed to the diode, through which the energy is transmitted. Discussion of the power-monitoring and feedback control of the laser diode by the photo diode is presented in U.S. Pat. Nos. 5,812,582 and 5,815,623. U.S. Pat. Nos. 5,812,582 and 5,815,623 are hereby incorporated herein by reference. The TO can is hermetically sealed. Often, optics housings are metallic so as to provide ruggedness, ease of machining complicated shapes, and to enhance shielding of electromagnetic fields.

Smaller optoelectronic packages allow the devices into which the optoelectronic packages are placed to become smaller. Smaller optoelectronic packages allow for a higher density of data transmission in a given space. Currently, there is a great demand for smaller optoelectronic packages.

FIG. 8 is a partial cross-sectional pictorial view of an optoelectronic package 200. The optoelectronic package 200 includes a base element 212, posts 206, 208, 210, extending through the base element 212 and secured thereto with solidified molten glass 214, a monitor diode 204 mounted on the base element 212, an optical emitting element 202 mounted on the monitor diode 204, a can 218 and lens 216 enclosing the monitor diode 204 and the optical emitting element 202. In an effort to reduce space, the optical emitting element 202 is mounted on top of the monitor diode 204. Electrically conductive posts 206, 208, 210 extend through through-holes in the electrically conductive base element 212. The posts 206, 208, 210 are electrically insulated from the base element 212 by solidified molten glass 214 which also attaches the posts 206, 208, 210 to the base element 212. The posts 206, 208, 210 are large as compared to the other components and require a large area for their mounting and placement.

At minimum, the diameter across the base element 212 is approximately 3.8 millimeters, as incorporated on the SLT2160-LN series of transmitter optical sub-assemblies manufactured by Sumitomo Electric Industries, Ltd. Thus, if two of these devices are placed side-by-side, on the same plane, the distance between the optical axes is, hypothetically, at best, 3.8 millimeters. However, typically, the optical axes are separated by 6.25 millimeters, due to packaging constraints as in typical LC duplex transceivers such as Methode Electronics, Inc.'s, part number MLC-25-4-X-TL which is described in the data sheet entitled, "MLC-25-4-X-TL Optical Gigabit Ethernet —+3.3V Small Form Factor (SFF) Transceiver—1.25 GBaud."

Therefore, there is a need in the industry for a small format optoelectronic package that has a small diameter and is easy to manufacture. Furthermore, there is a need for an optoelectronic package that can be placed adjacent to another optoelectronic package.

SUMMARY OF THE INVENTION

Therefore, it is an object of the present invention to provide a small format optoelectronic device.

It is still another object of the invention to provide a small format optoelectronic device which is hermetically sealed and economical to manufacture.

Yet another object of the invention is to provide a small format optoelectronic device which is able to be placed adjacent to another small format optoelectronic device.

It is a further object of the invention to provide a small format optoelectronic device which is easy to install, and provides for more efficient utilization of the limited surface area by incorporating rectangular geometry.

In one form of the invention, the small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an optical diode between the electrically conductive can and the non-electrically conductive substrate. The non-electrically conductive substrate has two through-holes formed through a thickness of the non-electrically conductive substrate. The two through-holes are filled with an electrically conductive material so as to form two electrically conductive vias. When co-fired with the substrate, the electrically conductive vias form a hermetic seal. Additionally, a surface of the non-electrically conductive substrate is organized into three regions. The third region has the electrically conductive plating material applied thereto. The first through-hole protrudes through the first region. The second through-hole protrudes through the second region. The first region has a first surface. The second region has a second surface. The first surface is at a different elevation than the second surface. The optical diode has a first lead or contact electrically connected to the first via, and the optical diode has a second lead electrically connected to the second via. The optical diode has a third surface, where the third surface is substantially coplanar with the second surface.

In another form of the invention, the small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an optical diode between the electrically conductive can and the non-electrically conductive substrate. The non-electrically conductive substrate has two through-holes formed through a thickness of the non-electrically conductive substrate. The two through-holes are filled with an electrically conductive material so as to form two electrically conductive vias. When co-fired with the substrate, the electrically conductive vias form a hermetic seal. Additionally, a surface of the non-electrically conductive substrate is organized into two regions. The second region has the electrically conductive plating material applied thereto. The first through-hole protrudes through the first region. The second through-hole protrudes through the first region. The optical diode has a first lead and a second lead. The first lead of the optical diode electrically connected to the first conductive via. A flex connector has a conductive trace. The conductive trace of the flex connector electrically connects the second lead of the optical diode to the second conductive via.

In yet another form of the invention, the small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an optical diode between the electrically conductive can and the non-electrically conductive substrate. The non-electrically conductive substrate has two through-holes formed through a thickness of the non-electrically conductive substrate. The two through-holes are filled with an electrically conductive material so as to form two electrically conductive vias. When co-fired with the substrate, the electrically conductive vias form a hermetic seal. Additionally, a surface of the non-electrically conductive substrate is organized into two regions. The second region has the electrically conductive plating material applied thereto. The first through-hole protrudes through the first region. The second through-hole protrudes through the first region. The optical diode has a first lead and a second lead. The first lead being electrically connected to the first conductive via. The second lead being electrically connected to the second conductive via. The optical diode is a flip-chip optical diode, where both the first lead and the second lead are positioned on one side of the optical diode. Solder balls electrically connect the leads to the vias. The optical signal emanates or alternatively is received from a surface of the optical diode which is opposite to the surface that contains the leads.

Thus, the device of the invention is superior to existing optoelectronic devices. The small format optoelectronic package of the invention eliminates the use of large and bulky components, and replaces them with smaller components through use of a unique combination of materials and arrangement of the materials. Thus, the device of the invention is smaller than the prior art device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PRESENTLY PREFERRED EMBODIMENTS

Figure 1:
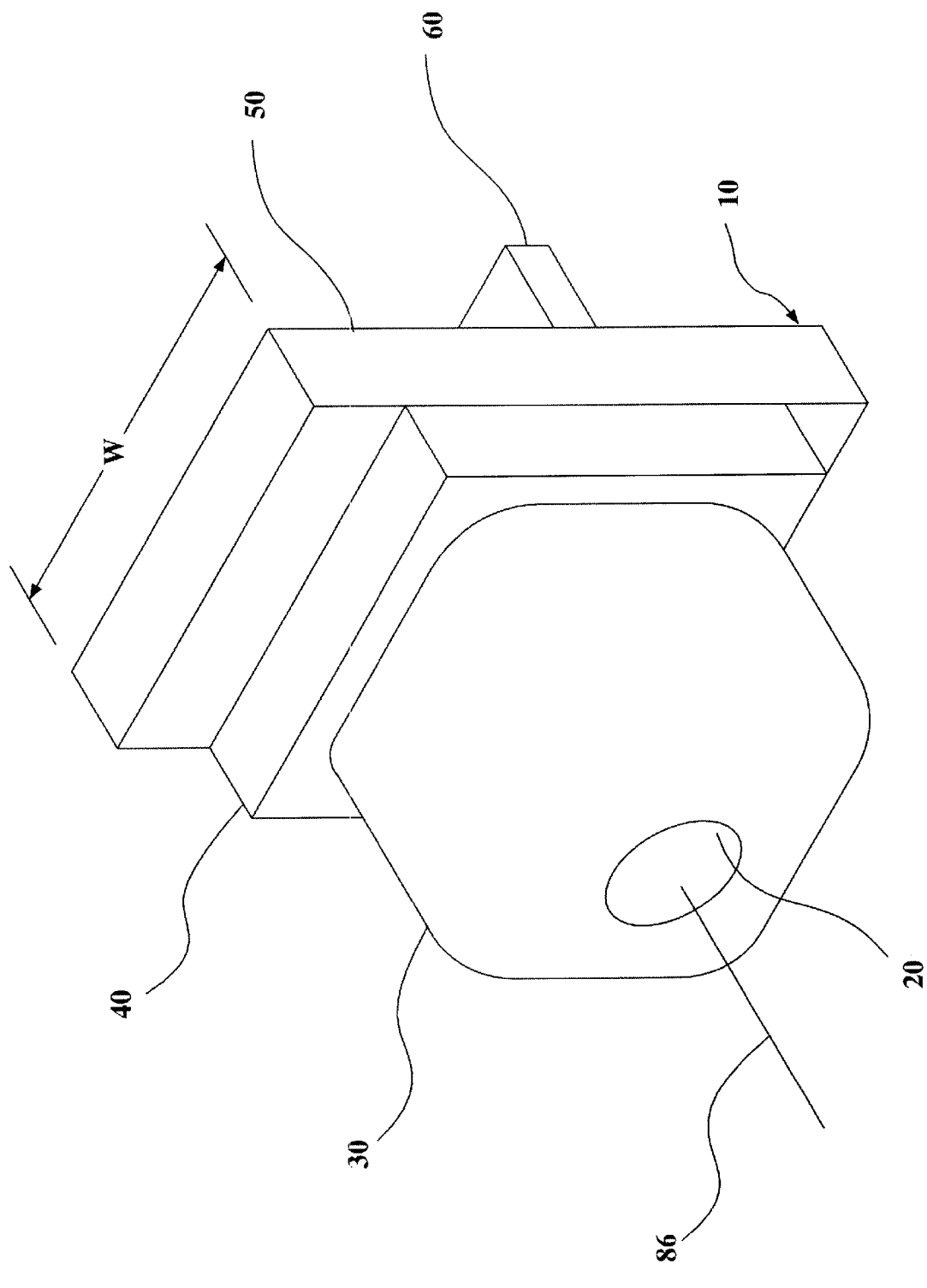
FIG. 1 is a perspective view of an optoelectronic package.

Referring now to the drawings, wherein like reference numerals designate identical or corresponding parts throughout the several views, and more particularly to FIGS. 9–12 thereof, is a small format optoelectronic package or device 300. However, a small format optoelectronic package or device 10, 110 as shown in FIGS. 1–7 is discussed first since the embodiments disclosed in FIGS. 9–19 depend on the disclosure of the devices 10, 110.

FIG. 1 is a perspective view of the optoelectronic package 10 which shows a transparent element 20 mounted in an electrically conductive can 30, where the electrically conductive can 30 is mounted on and sealed to an electrically conductive plating adhered to a non-electrically conductive substrate. The device 10 can be attached to a housing of another structure by way of the holder 50.

The holder 50 is mounted to the non-electrically conductive substrate 40. The holder 50 has a width dimension W. A flex connector 60 is attached to a second side of the non-electrically conductive substrate 40.

Figure 2:
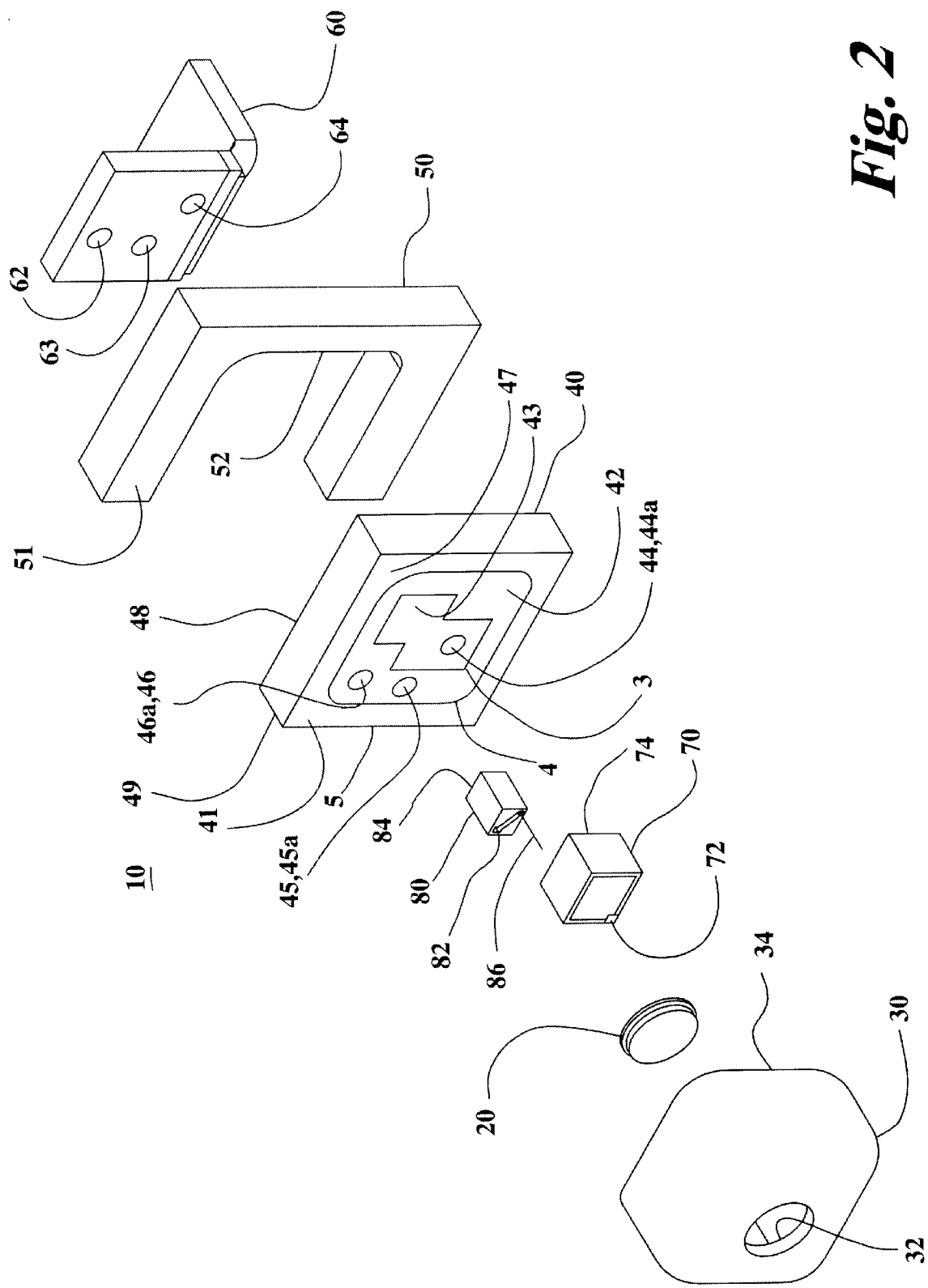
FIG. 2 is an exploded perspective view of the optoelectronic package of FIG. 1.

FIG. 2 is an exploded perspective view of the optoelectronic package 10 of FIG. 1. The electrically conductive can 30 has a first aperture 32 and a second aperture 34. The transparent element 20 is mounted on and sealed to the first aperture 32 of the electrically conductive can 30 by means known in the art. One means includes using glass frit powder packed around the transparent element 20 while it is in the first aperture 32 of the electrically conductive can 30 and then firing the assembly so as to cause the glass frit powder to flow and to bond and to hermetically seal the transparent element 20 in the first aperture 32. Another means includes molding or flowing molten glass into the first aperture 32 and letting the molten glass solidify, thus forming the transparent element 20. The non-electrically conductive substrate 40 has a first surface 47 and a second surface 48 separated by a thickness as identified along edge 49, the thickness is between 0.008 inches and 0.025 inches, however, the thickness can go up to 0.035 inches. The first surface 47 is divided into 3 regions. The first region 43 is bound by line 3. The second region 42 is bound by lines 3 and 4. The third region 41 is bound by lines 4 and 5. The regions include a first region 43, a second region 42, and a third region 41. The first region 43 is separated from the third region 41 by the second region 42.

The non-electrically conductive substrate 40 includes three through-holes. The three through-holes include the first through-hole 44, a second through-hole 46, and a third through-hole 45. Each through-hole has a diameter of approximately 0.010 inches. An electrically conductive plating or coating is adhered to the first surface 47 of the non-electrically conductive substrate 40 in the first region 43 and in the third region 41. The plating typically has a thickness of 0.003 inches. Furthermore, the electrically conductive material, which can be the same as the plating material, substantially fills the first through-hole 44, the second through-hole 46, and the third through-hole 45, so as to form first, second, and third conductive vias 44a, 46a, and 45a, respectively. Each electrically conductive via is substantially co-planar with the surfaces 47, 48 of the non-electrically conductive substrate 40. Specifically, the vias do not substantially protrude into the space defined by the transparent element 20, the electrically conductive can 30, and the non-electrically conductive substrate 40, so as to enable surface mounting of components directly on top of the vias. The first conductive via is electrically connected to the electrically conductive plating of the first region 43. The optical diode 80 has a first lead 82 and a second lead 84. The optical emitting diode 80 has an optical axis 86 along which optical energy is transmitted. The second lead 84 of the optical diode 80 is electrically connected to an electrically conductive plating of the first region 43 and mounted thereto by way of electrically conductive epoxy (not shown). The monitor diode 70 has a first lead 74 and a second lead 72. The first lead 74 of the monitor diode 70 is electrically connected to the electrically conductive plating of the first region 43. The monitor diode 70 is mounted to the electrically conductive plating of the first region 43 by way of electrically conductive epoxy (not shown). A longitudinal axis of the first through-hole 44 passes through the monitor diode 70. However, the optical diode 70 can be placed over the first through-hole 44 instead of the monitor diode 80.

To attach the holder 50 to the non-electrically conductive substrate 40, a portion of the second surface 48 has the electrically conductive plating adhered thereto and to which the holder 50 is either brazed or soldered. Alternatively, glass frit powder can be placed between the holder 50 and the non-electrically conductive substrate 40 and then the assembly is fired so as to bond the holder 50 to the non-electrically conductive substrate.

The electrically conductive can 30 is then mounted on and sealed to the third region 41 of the non-electrically conductive substrate 40. The electrically conductive can 30 is soldered to electrically conductive plating adhered to the third region 41. The optical emitting diode 80 and monitor diode 70 are hermetically sealed and protected from atmospheric and environmental contaminants so as to ensure the integrity of a transmitted data signal. Preferably, the sealed-off region is filled with a dry inert gas. Examples of the inert gas include nitrogen and argon. In another embodiment, the sealed-off region is in a vacuum. The holder 50 has a first surface 51 and a concave portion 52. The first surface 51 is soldered to electrically conductive plating adhered to the non-electrically conductive substrate. The flex connector 60 has three conductive traces, which includes a first conductive trace 64, a second conductive trace 62, and a third conductive trace 63. The flex connector 60 may be formed of a polyimide film, such a material is marketed under the trade name, KAPTON, which is sold by E.I. Du Pont de Nemours and Company. The conductive traces 62, 63, and 64 transmit electrical data and power signals to the diodes 70, 80. The flex connector 60 passes through the concave portion 52 of the holder 50 and each of the conductive traces electrically connects with respective electrically conductive vias. That is, the first conductive trace 64 electrically connects to conductive via 44a, electrically conductive trace 62 electrically connects to electrically conductive via 46a, and electrically conductive trace 63 electrically connects to electrically conductive via 45a.

Figure 3:
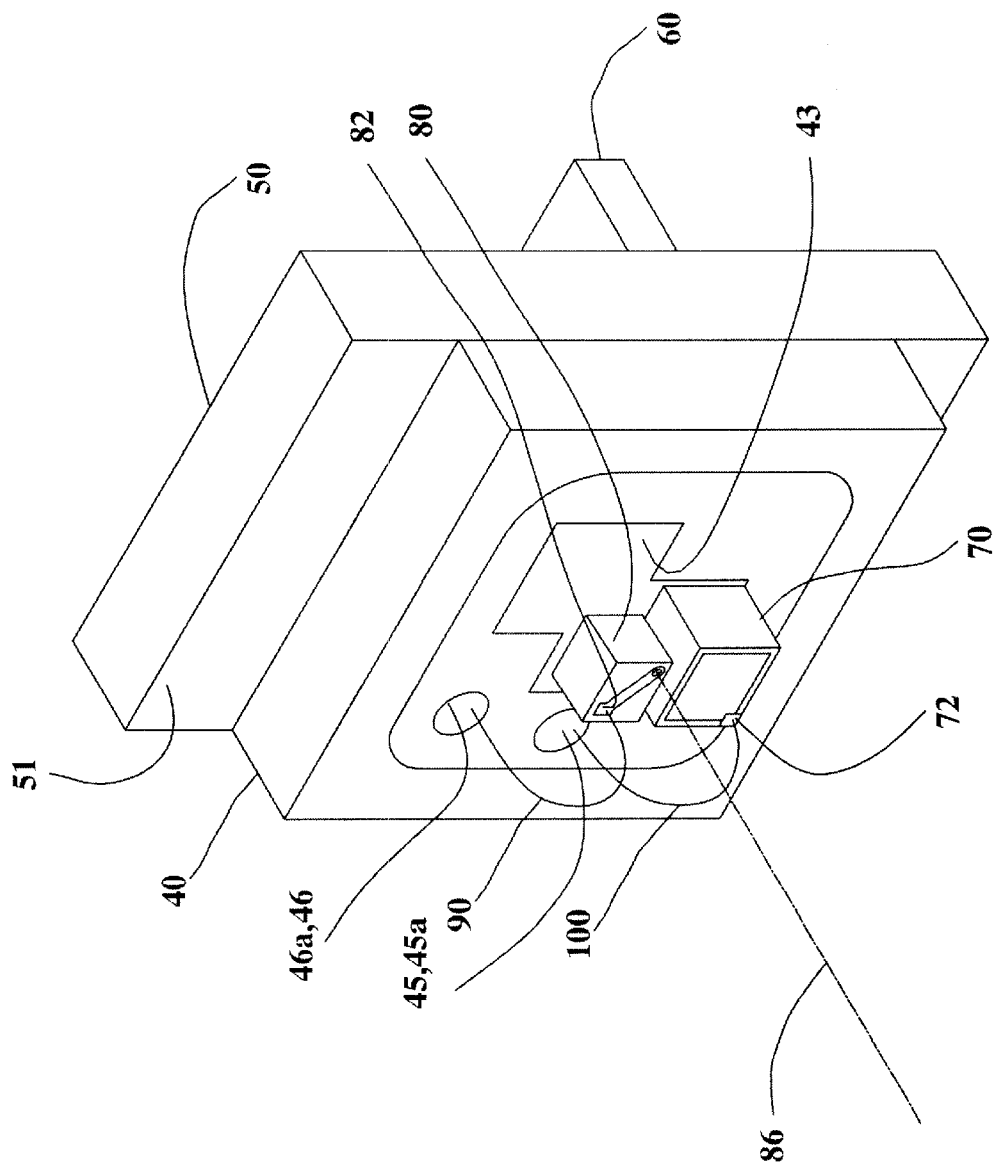
FIG. 3 is a perspective view of the monitor diode, optical diode, base substrate, holder, and flex connector of the optoelectronic package of FIG. 1.

FIG. 3 is a perspective view of the monitor diode 70, the optical diode 80, the non-electrically conductive substrate 40, the holder 50, and the flex connector 60 of the small format optoelectronic package 10 of FIG. 1. FIG. 3 shows the optical diode 80 and the monitor diode 70 mounted to the first region 43 of the non-electrically conductive substrate 40. FIG. 3 further shows the optical axis 86 of the optical diode 80. A first conductor 90, for example, a wire bond, electrically connects the first lead 82 of the optical diode 80 to the electrically conductive material filling the second through-hole 46 or to a metallized region surrounding the via. A second conductor 100 electrically connects the second lead 72 of the monitor diode 70 to the electrically conductive material filling the third through-hole 45 or to a metallized region surrounding the via.

The holder 50 needs to be solderable and weldable, as well as having a coefficient of thermal expansion which generally is the same as the coefficient of thermal expansion of the non-electrically conductive substrate 40 which is a ceramic material. Such materials include FeNi and FeNiCo. Specifically, a material having twenty-nine percent Ni, seventeen percent Co, and the balance Fe trades under the name KOVAR, the name is owned by Carpenter Technology Corporation. The flex connector 60 has a base substrate made of a flexible insulating material such as KAPTON and on which electrically conductive traces are laid. Non-electrically conductive substrate 40 is made of a ceramic material such as alumina, AlN or BeO. The electrically conductive plating material is typically made of a mixture of glass, palladium, and silver which is mixed together, applied to the ceramic material, and heated to a molten state and allowed to solidify. The glass component of the mixture fuses with the base ceramic material of the non-electrically conductive substrate 40. The palladium/silver component of the mixture provides for the electrical conductivity of the plating. The electrically conductive can 30 is typically made of an alloy, such as KOVAR, which has a coefficient of thermal expansion which generally is the same as the coefficient of thermal expansion for both the non-electrically conductive substrate 40 which is ceramic and the transparent element 20 which is glass. The electrically conductive can 30 is attached to the electrically conductive plating material adhered to the third region 41 of the non-electrically conductive substrate 40 in order to form a hermetic barrier. The electrically conductive can 30 is attached to the non-electrically conductive substrate 40, preferably, by a soldering process or by a brazing process. The transparent element 20 is made of glass or sapphire. The conductors 90, 100 are substantially made of gold and are affixed to the vias 45a, 46a and to the leads 72, 82 by way of a gold bond technique where the gold conductor touches the lead, which is held at a temperature above ambient, or via and is vibrated. An exposed surface of the vias may have a secondary plating of gold to enhance wire bond adhesion. The vibrations and the elevated temperature cause the gold conductor to adhere to the lead. One such method of wire bonding is disclosed in U.S. Pat. No. 5,938,952 which is hereby incorporated herein by reference.

Figure 8:
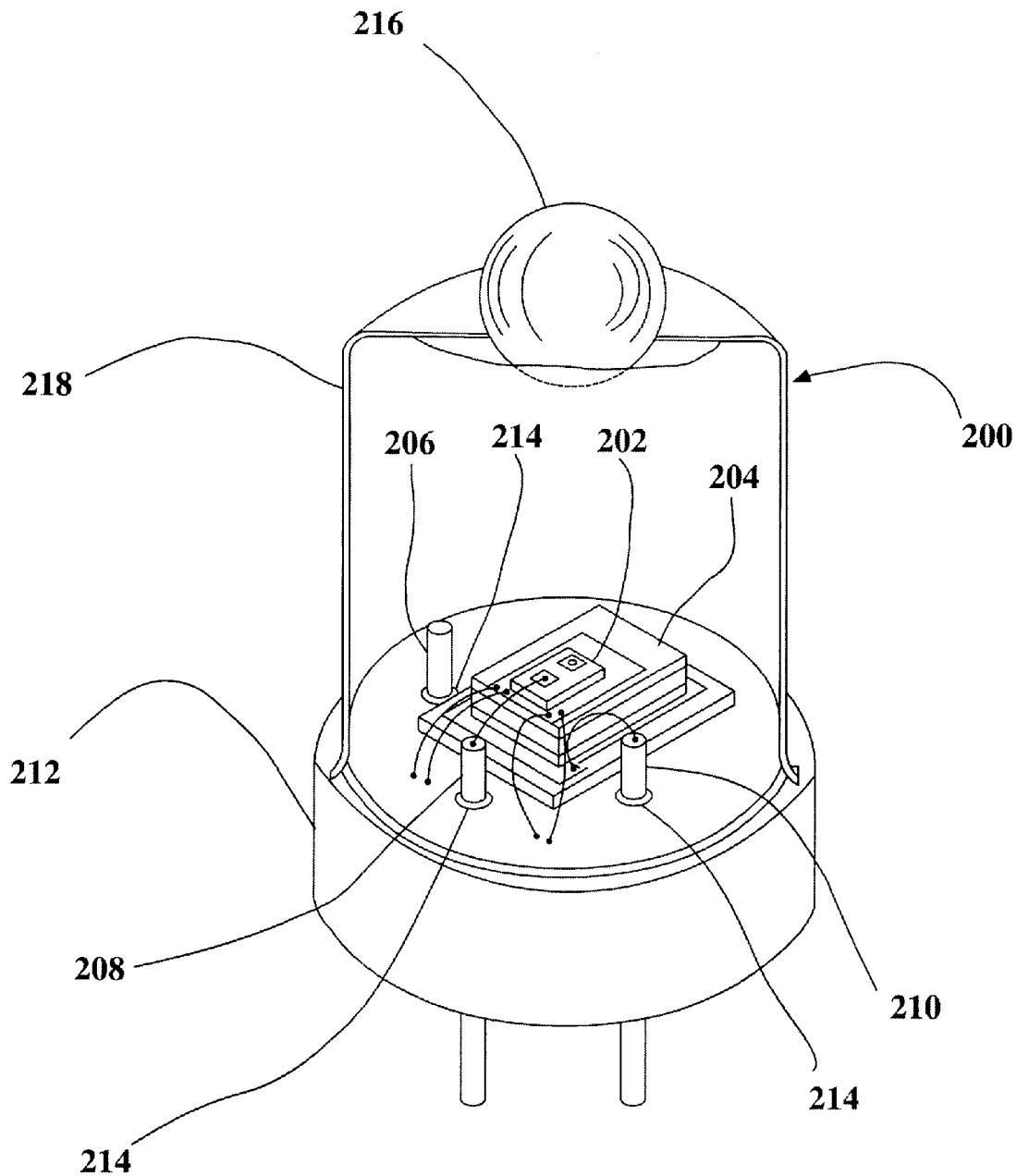
FIG. 8 is a partial cross-sectional perspective view of a related optoelectronic package.

The unique combination of materials and arrangement of components allows the width dimension W to be 3.25 millimeters or less. The optical axis 86 is positioned midway along the width dimension W. As compared to the device 200 of the related art shown in FIG. 8, the device 10 of FIG. 1 is compact. The non-electrically conductive substrate 40 has electrically conductive vias 44a, 45a, and 46a, and electrically conductive regions 41 and 43, which forms an unique electrical circuit arrangement based on geometry and material selection. The non-electrically conductive substrate 40 also has a unique shape which is rectangular or square. The shape and materials of construction allow two or more of the devices 10 to be placed together, and eliminate the wasted area present on the device 200 of FIG. 8.

Figure 7:
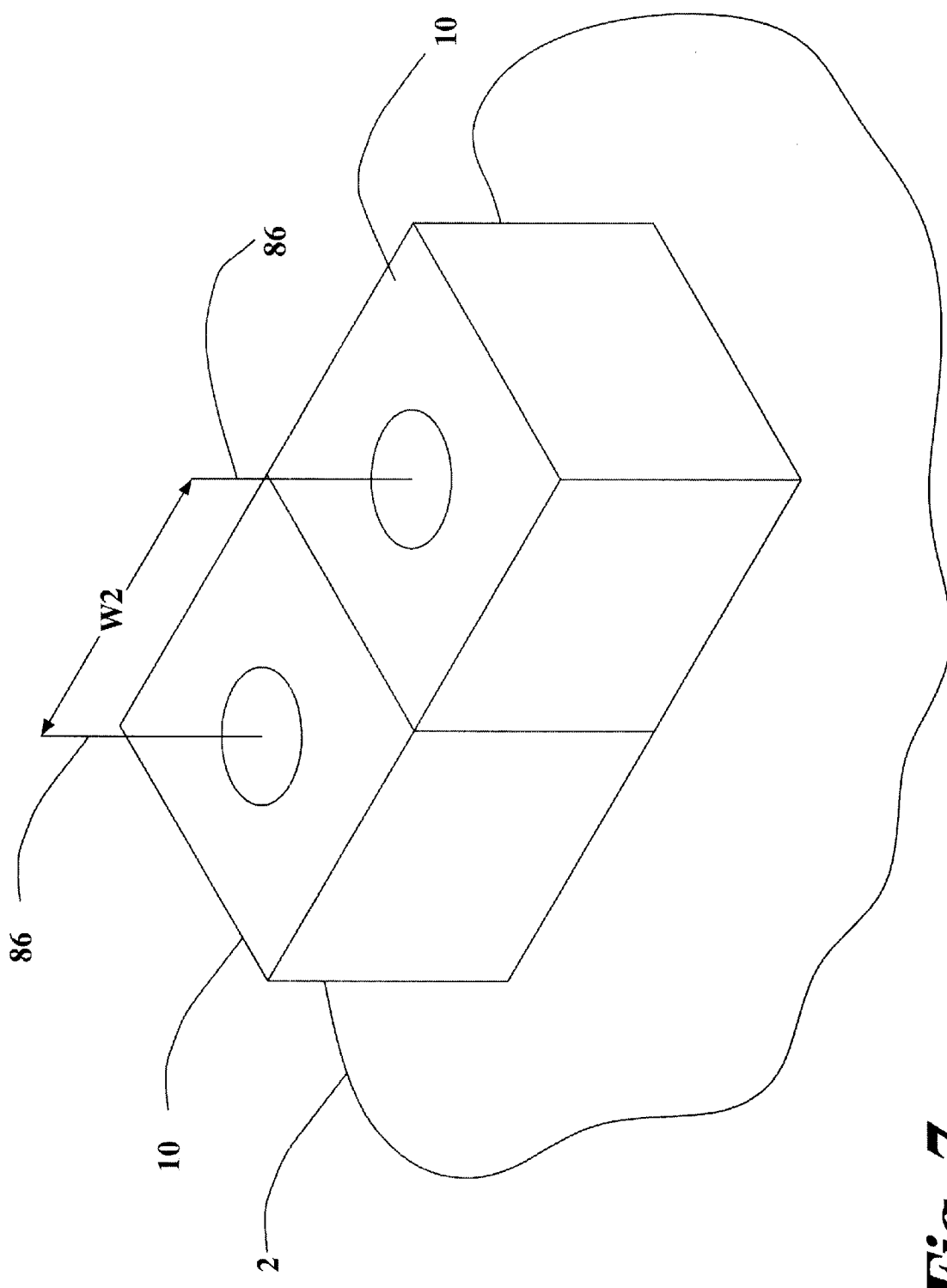
FIG. 7 is a perspective view of two optoelectronic packages positioned side-by-side on a planar surface.

The structure of the small format optoelectronic package or device 10 allows for two of the devices 10, 10 to be placed on the same plane 2 adjacent to each other, as shown in FIG. 7. In such an arrangement, the optical axis 86 of each device 10 are separated by a distance, W2. The distance, W2, is 3.25 millimeters or less.

Figure 4:
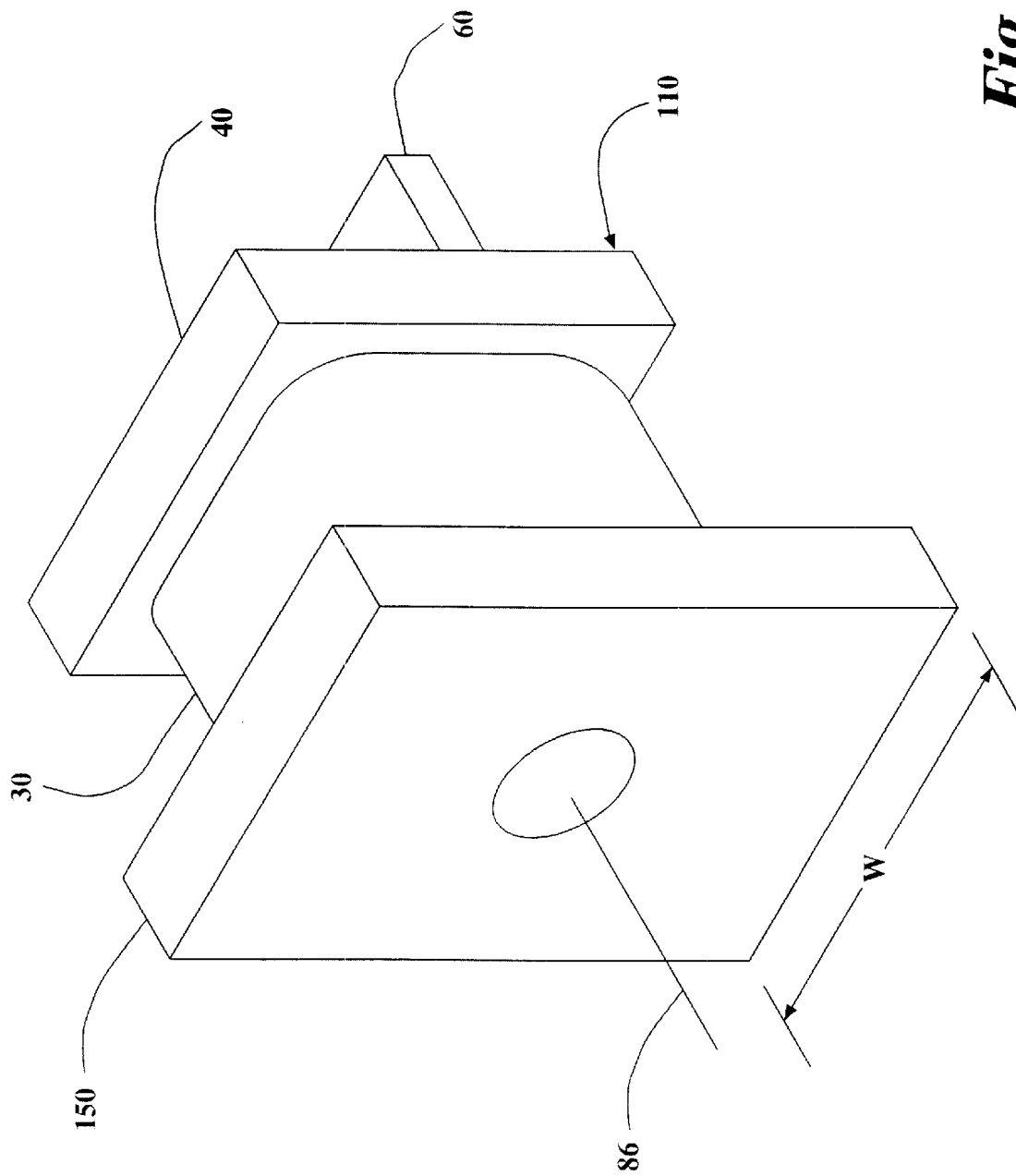
FIG. 4 is a perspective view of a second embodiment of the optoelectronic package.
Figure 5:
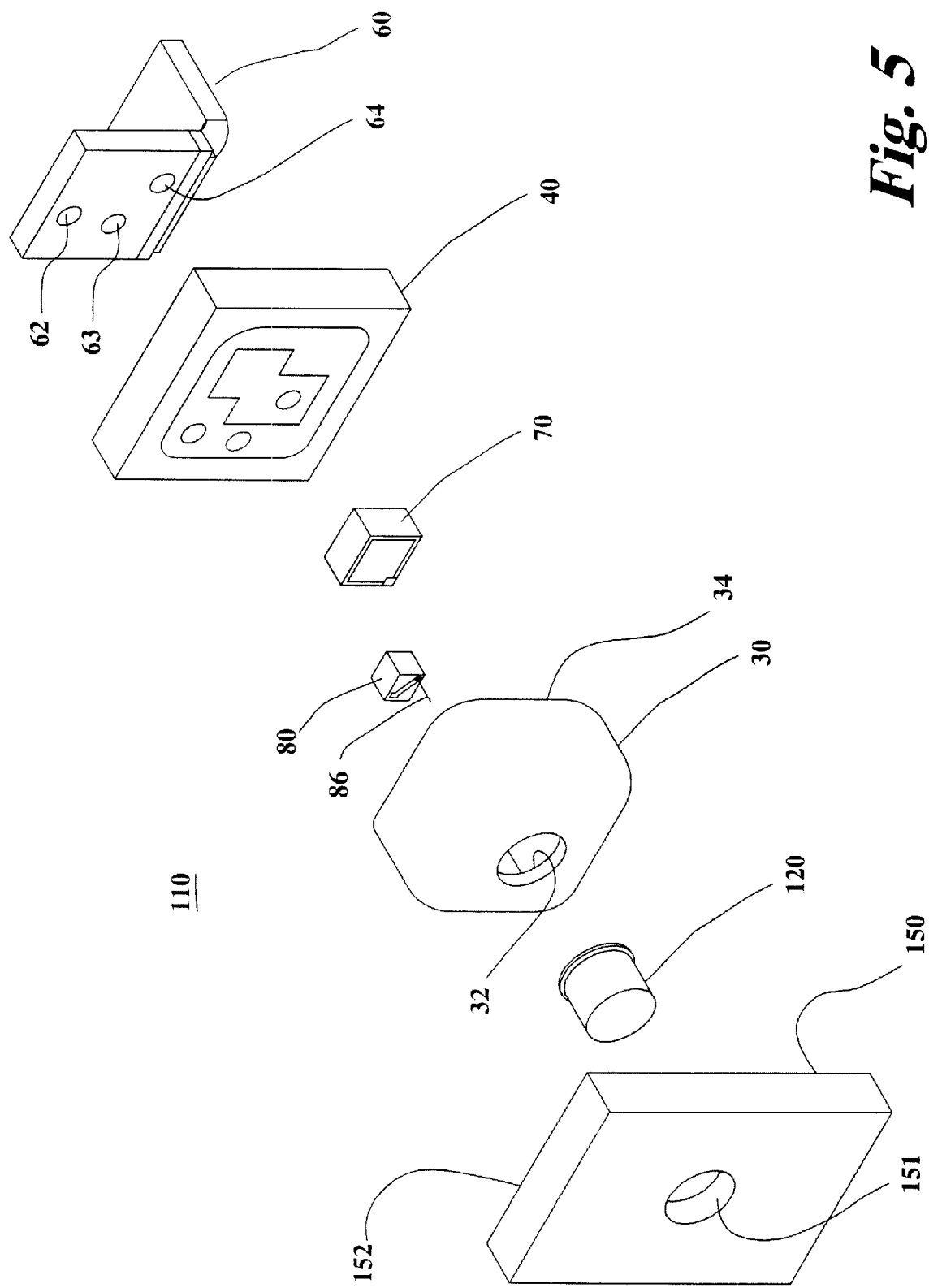
FIG. 5 is an exploded perspective view of the optoelectronic package of FIG. 4.
Figure 6:
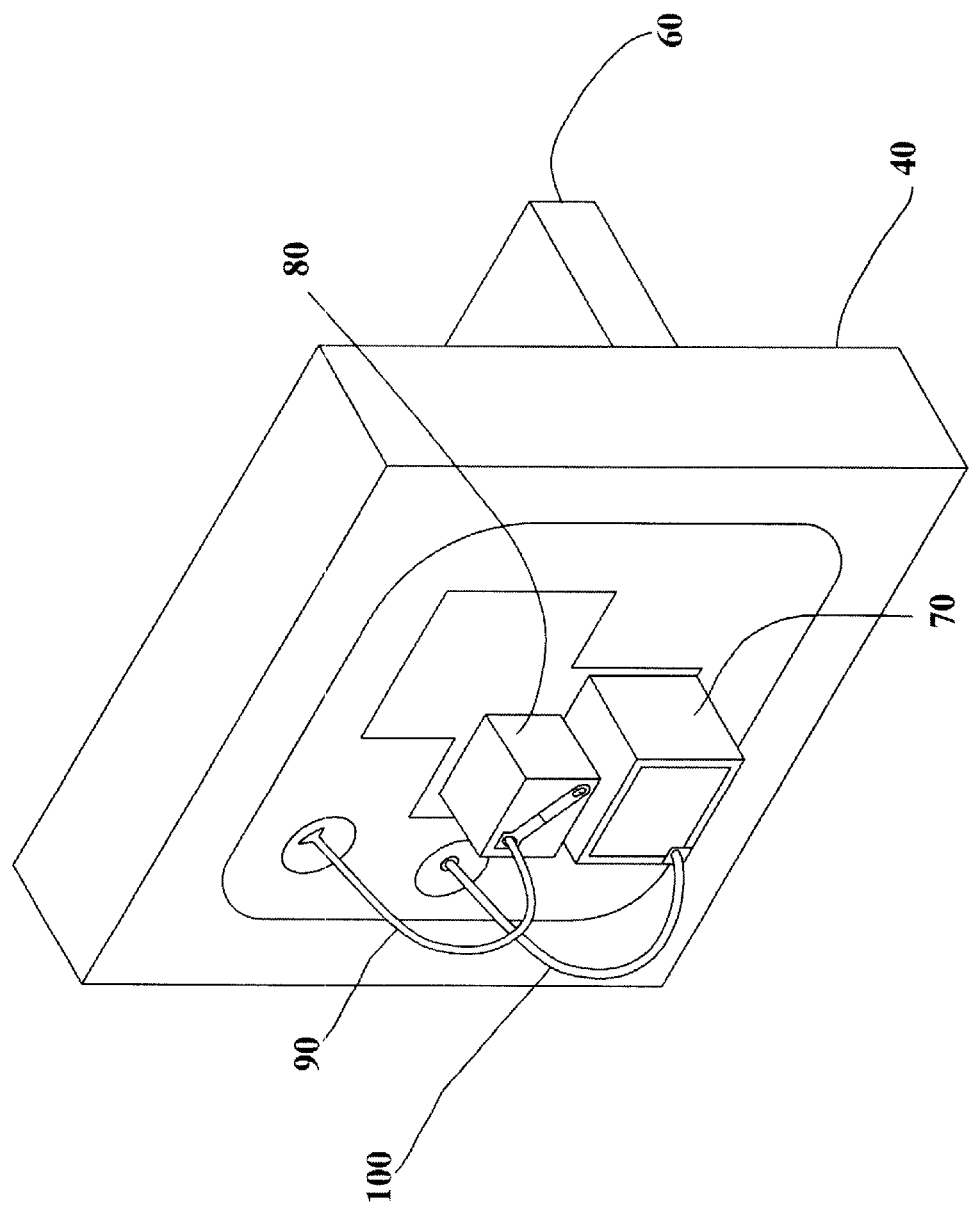
FIG. 6 is a perspective view of the monitor diode, optical diode, base substrate, and flex connector of the optoelectronic package of FIG. 4.

FIGS. 4–6 show a second version of the small format optoelectronic package or device 110. The device 110 includes many of the same components as does the device 10. The device 110 includes the optical diode 80, the monitor diode 70, the non-electrically conductive substrate 40, the flex connector 60, the electrically conductive can 30, and first and second conductors 90, 100. Since the listed components are the same as previously discussed in regard to device 10 they are not discussed further in the discussion of the embodiment of device 110.

A transparent element 120 is mounted on and sealed to the first aperture 32 of the electrically conductive can 30. A holder 150 has an aperture 151 and a surface 152. The aperture 151 receives the transparent element 120. The surface 152 of the holder 150 is brazed or welded to the electrically conductive can 30. The device 110 can be mounted within another housing by way of the holder 150 from a location of the electrically conductive can 30 which is different than the device 10. The materials of construction are similar to those discussed in regard to the device 10.

Figure 9:
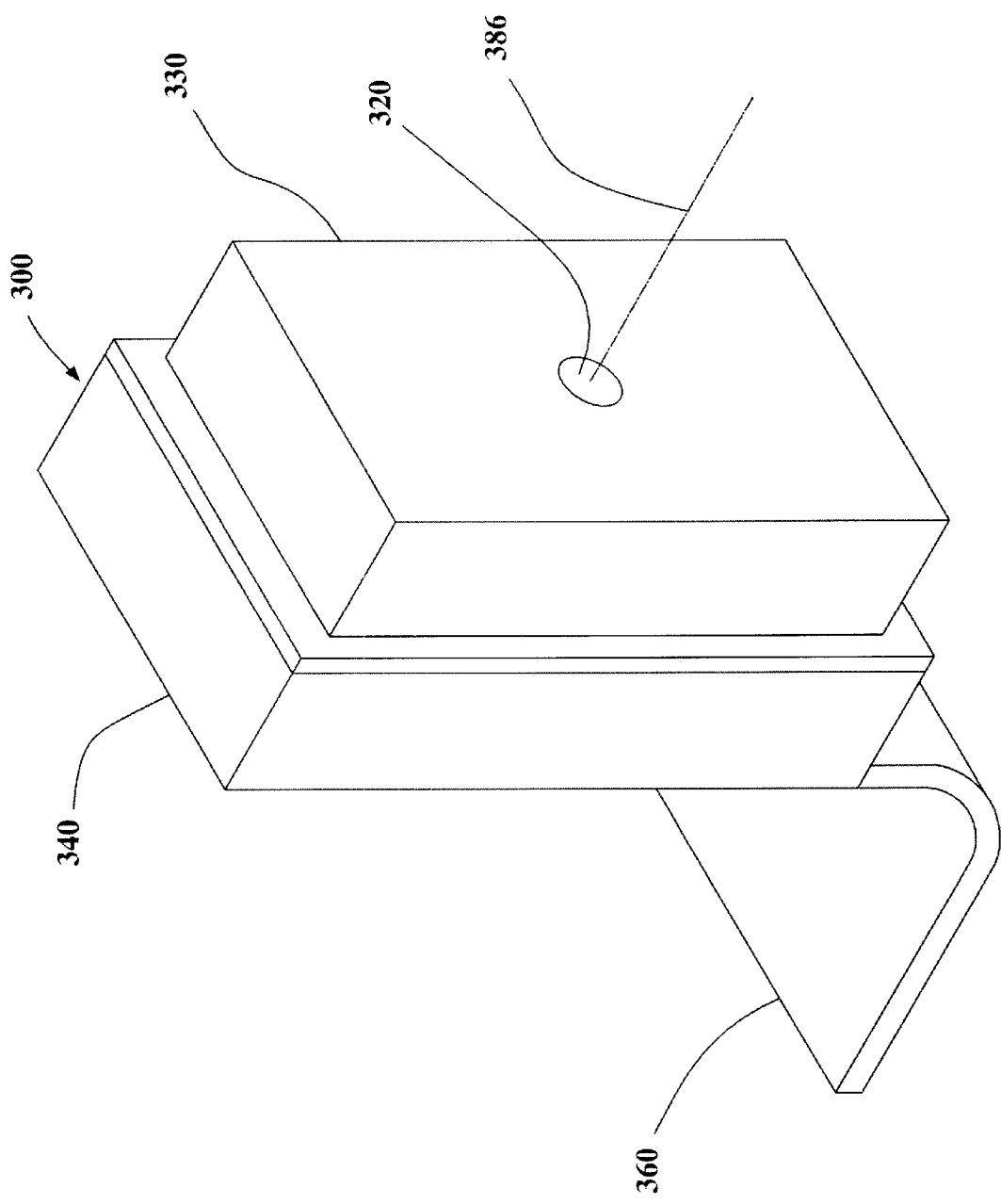
FIG. 9 is a perspective view of an optoelectronic package having a can manufactured by a machining process or a powder metallurgy process.

A first embodiment of the invention is shown in FIGS. 9–12. FIG. 9 is a perspective view of the optoelectronic package 300 which shows a transparent element 320 mounted in an electrically conductive can 330, where the electrically conductive can 330 is mounted on and sealed to an electrically conductive plating adhered to a non-electrically conductive substrate 340. Attached to the non-electrically conductive substrate 340 is a flex connector 360. An optical axis 386 is shown projecting through the transparent element 320.

The can 330 is either machined or made by a powder metallurgy process. In this embodiment, the can 330 has a low profile as compared to can 30 shown in FIG. 1 which is manufactured by a drawing process. Machining processes are well understood by those skilled in the art and are not further discussed. The powder metallurgy process includes powder metal sintering, and powder metal forging both of which are well understood by those skilled in the art and are not further discussed.

Figure 10:
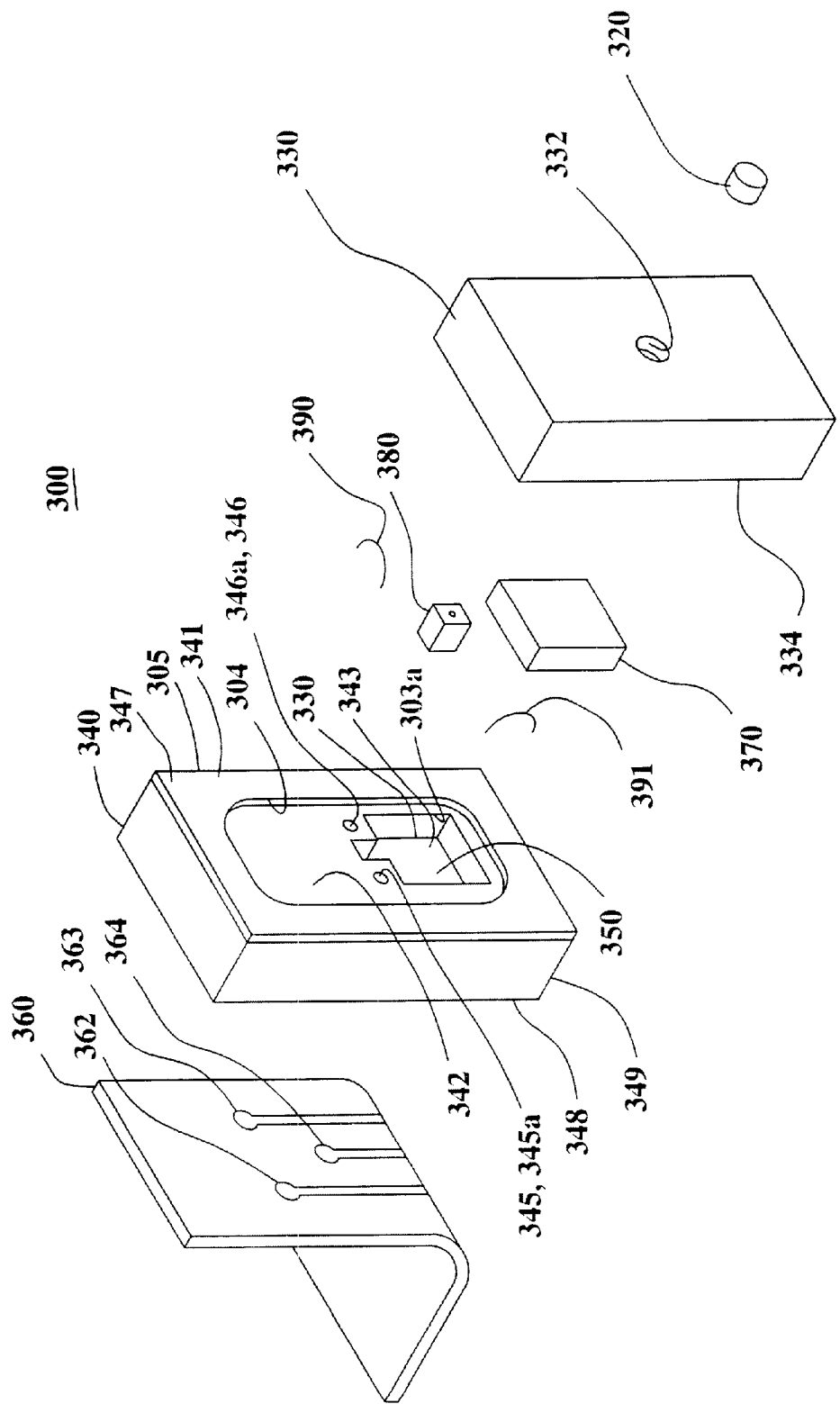
FIG. 10 is an exploded perspective view of the optoelectronic package of FIG. 9.

FIG. 10 is an exploded perspective view of the device 300 shown in FIG. 9. The electrically conductive can 330 has a first aperture 332. The transparent element is mounted on and hermetically sealed to the first aperture 332. The non-electrically conductive substrate 340 has a first surface 347 and a second surface 348 separated by a thickness as identified along edge 349. The first surface 347 is divided into three regions. The regions include a first region 343, a second region 342, and a third region 341. The first region 343 is separated from the third region 341 by the second region 342. The first region 343 is bound by line 303. The second region 342 is bound by lines 303a and 304. The third region 341 is bound by lines 304 and 305. The first region 343 is located in a depressed space 350 as compared to the second and third regions 342, 341. An optical emitting element such as a VCSEL or detector such as a PIN diode 380 and a monitor diode 370 are mounted within the depressed space 350.

The non-electrically conductive substrate 340 includes three through-holes. The three through-holes include the first through-hole 344 (see FIG. 12), a second through-hole 346, and a third through-hole 345. An electrically conductive plating or coating is adhered to the first surface 347 of the non-electrically conductive substrate 340 in the first region 343 and in the third region 341. Furthermore, the first, second, and third through-holes 344, 346, 345, are filled with the electrically conductive material so as to form first, second, and third conductive vias 344a, 346a, and 345a, respectively, which hermetically seal the through-holes.

The can 330 is hermetically sealed to the conductive plating occupying the third region 341 along a second aperture 334 of the can 330. The flex connector 360 has conductive traces 362, 363, and 364. Conductive trace 362 is electrically connected to conductive via 345a, conductive trace 364 is electrically connected to conductive via 344a, and conductive trace 363 is electrically connected to conductive via 346a.

Figure 11:
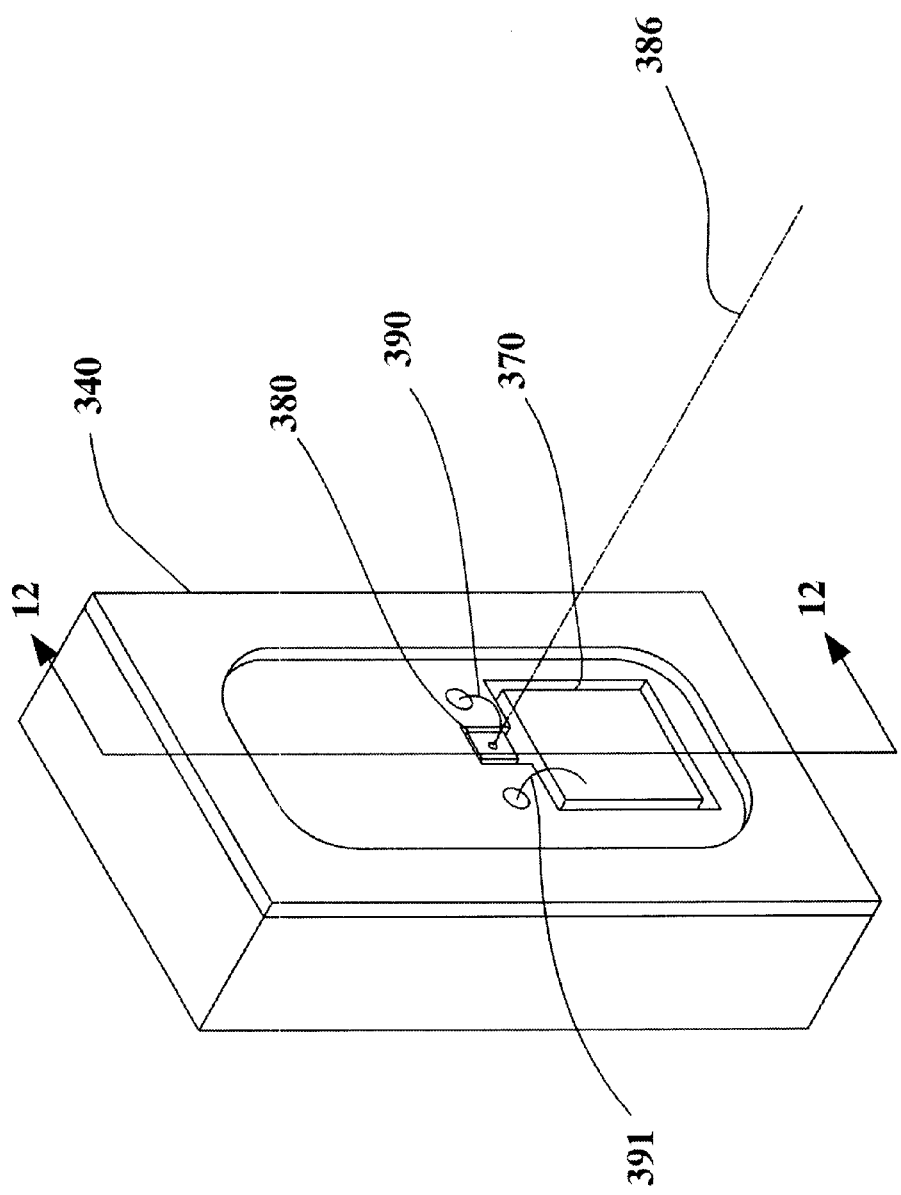
FIG. 11 is a perspective view of the optoelectronic package of FIG. 9 with the can removed.

FIG. 11 is a perspective view of the non-electrically conductive substrate 340 having the optical diode 380 and the monitor diode 370 mounted in the depressed space 350. Wire bond 390 electrically connects the optical diode 380 to the second via 346a. Wire bond 391 electrically connects the monitor diode 370 to the third via 345a. FIG. 11 shows that the exposed surfaces of the optical diode 380 and the monitor diode 370 are substantially flush or exist in the same plane as do the second and third regions 342, 341 of the first surface 347.

Figure 12:
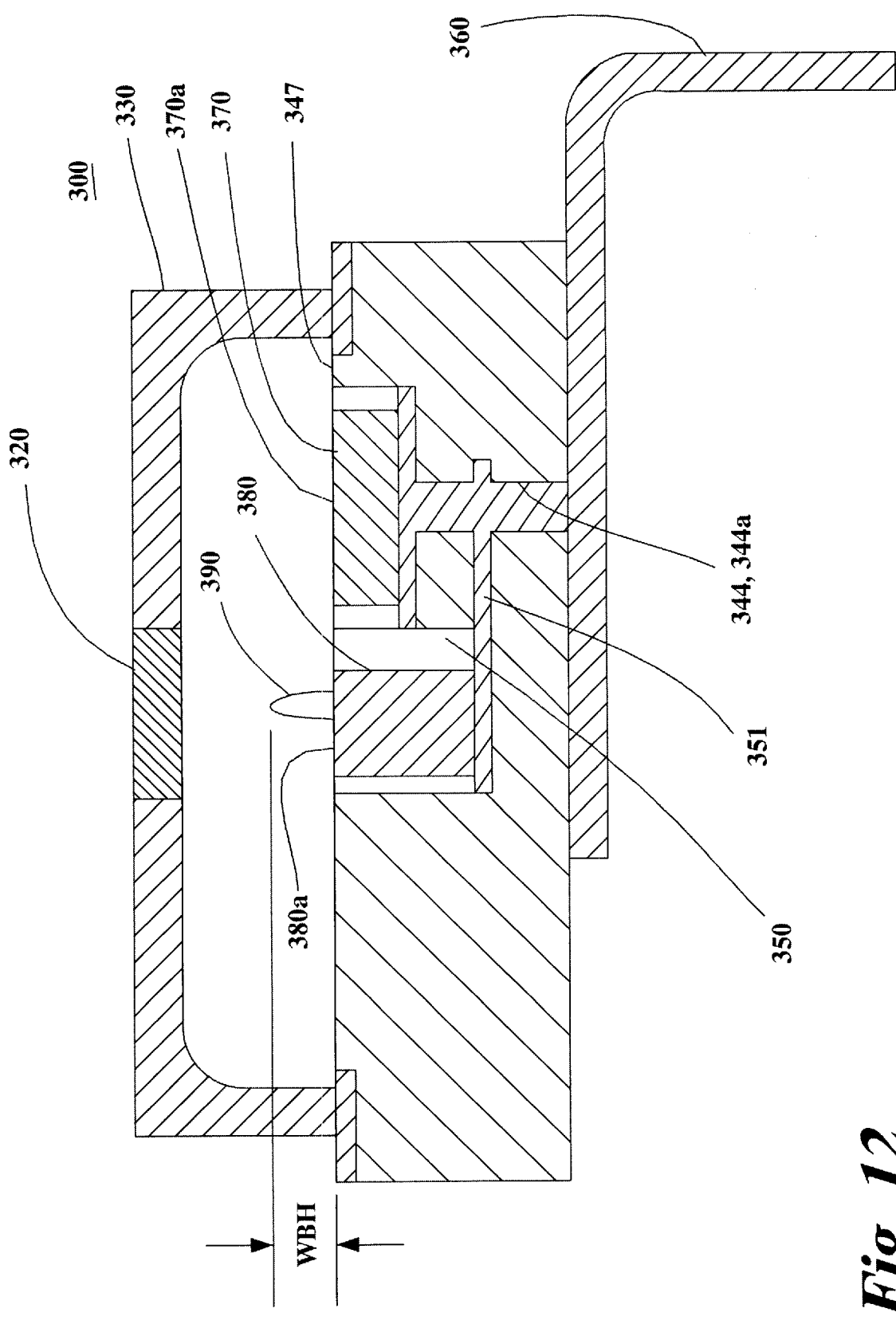
FIG. 12 is a cross-sectional view of the optoelectronic package of FIG. 9 taken along section line 11—11 of FIG. 11.

FIG. 12 is a cross-sectional view of the device 300 of FIG. 9 taken along section line 12—12 of FIG. 11. FIG. 12 shows the height of the wire bond as dimension WBH. Furthermore, the depressed space 350 is shown to have multiple levels so as to substantially make co-planar surfaces 380a, 370a of the optical diode 380, the monitor diode 370, respectively, and the second and third regions 342, 341, of the first surface 347. The optical diode 380 and the monitor diode 370 are electrically connected to the first region 343. A horizontal conductor 351 electrically connects the optical diode 380 to the electrically conductive via 344a. The wire bond height WBH needs to be high enough so that the wire bond attachment points should be as nearly normal to the attachment surface as possible while observing a minimum bend radius rule so as to reduce stress. Thus, the wire bond height WBH is minimized when all of the attachment points of the wire bond occur on the same plane. The wire bond height determines the height of the can 330. If the wire bond height is small then the height of the can 330 is small. The device 300 as shown in FIGS. 9–12 presents such an embodiment.

Figure 13:
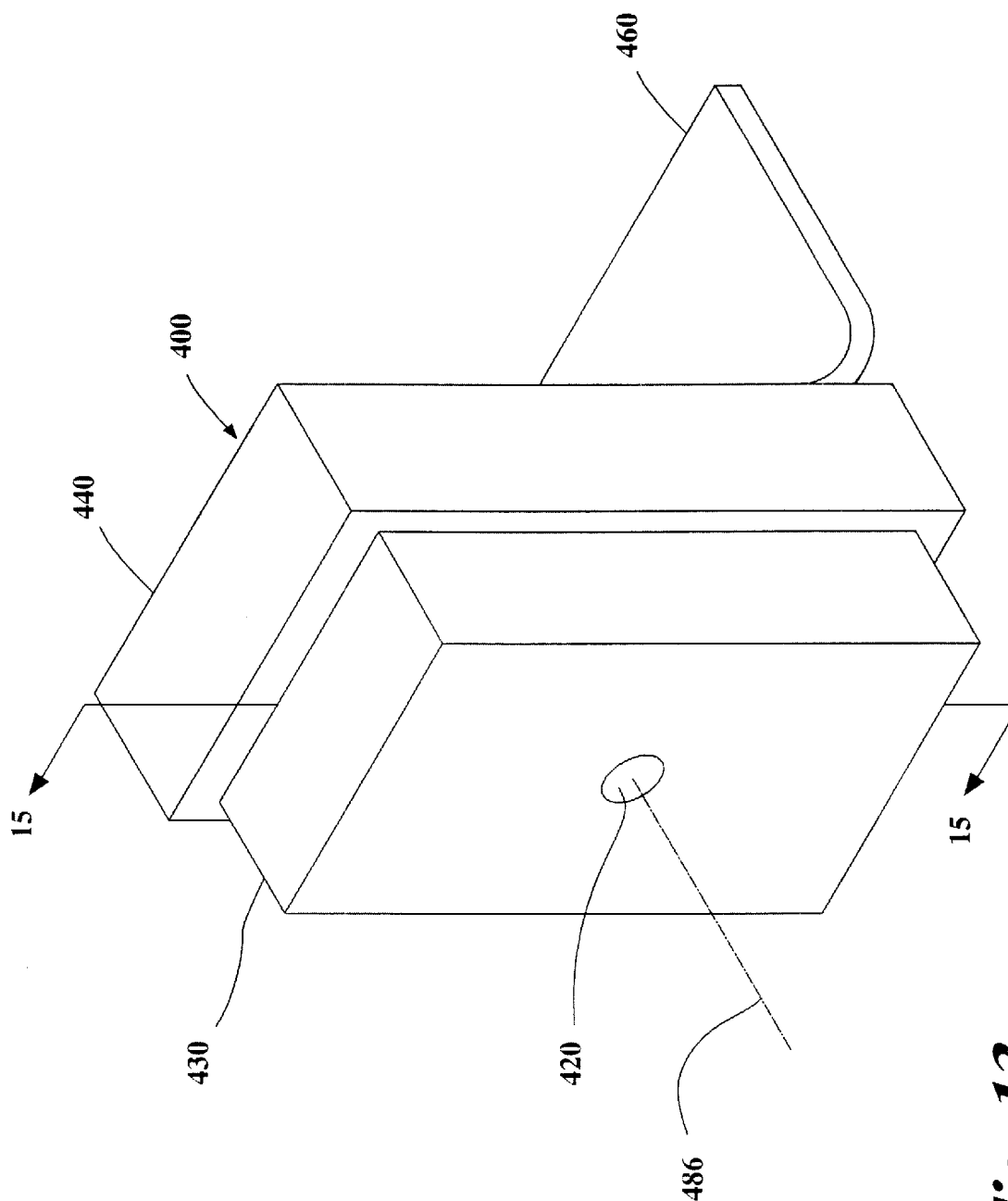
FIG. 13 is a perspective view of another optoelectronic package.
Figure 14:
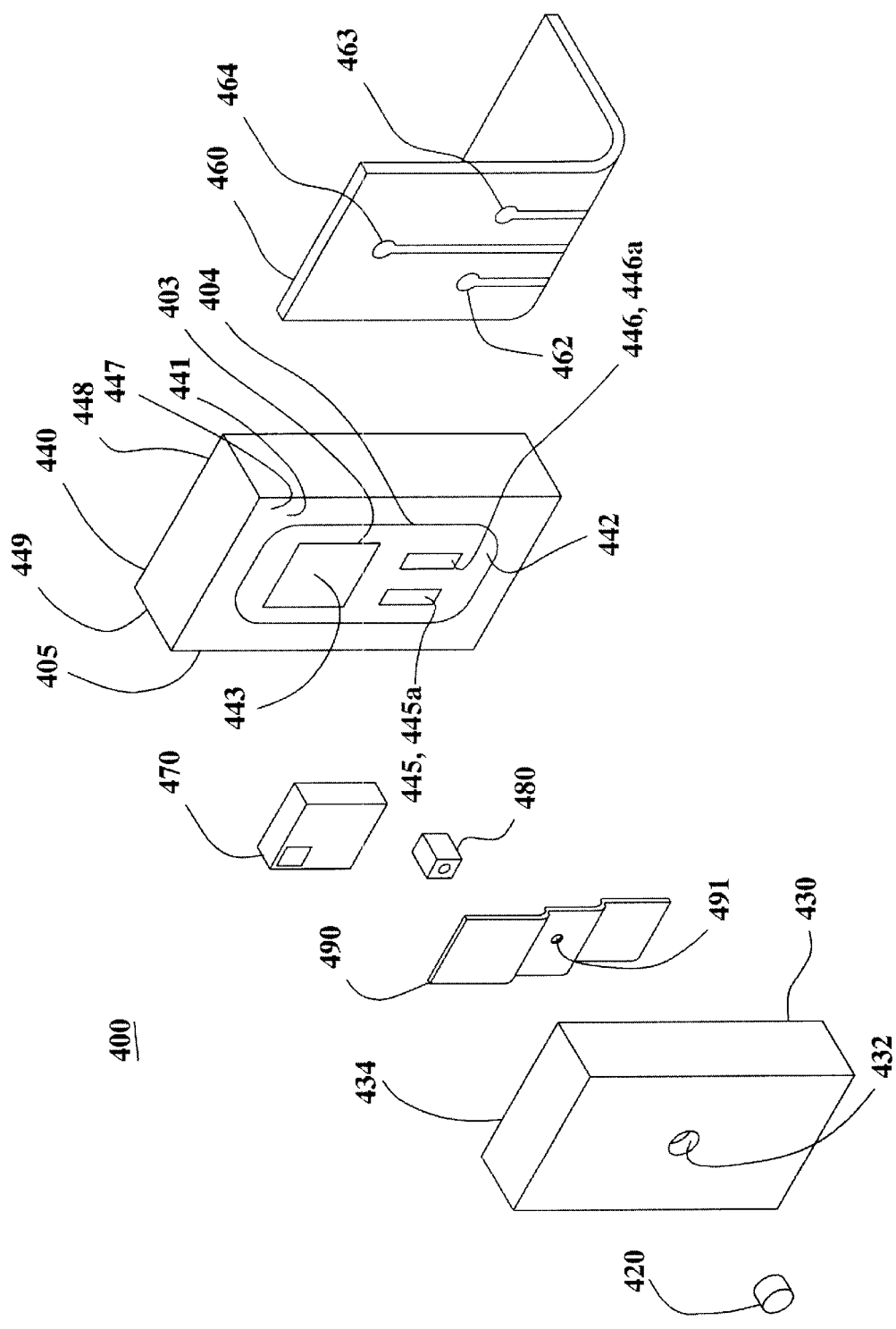
FIG. 14 is an exploded perspective view of the optoelectronic package of FIG. 13.
Figure 15:
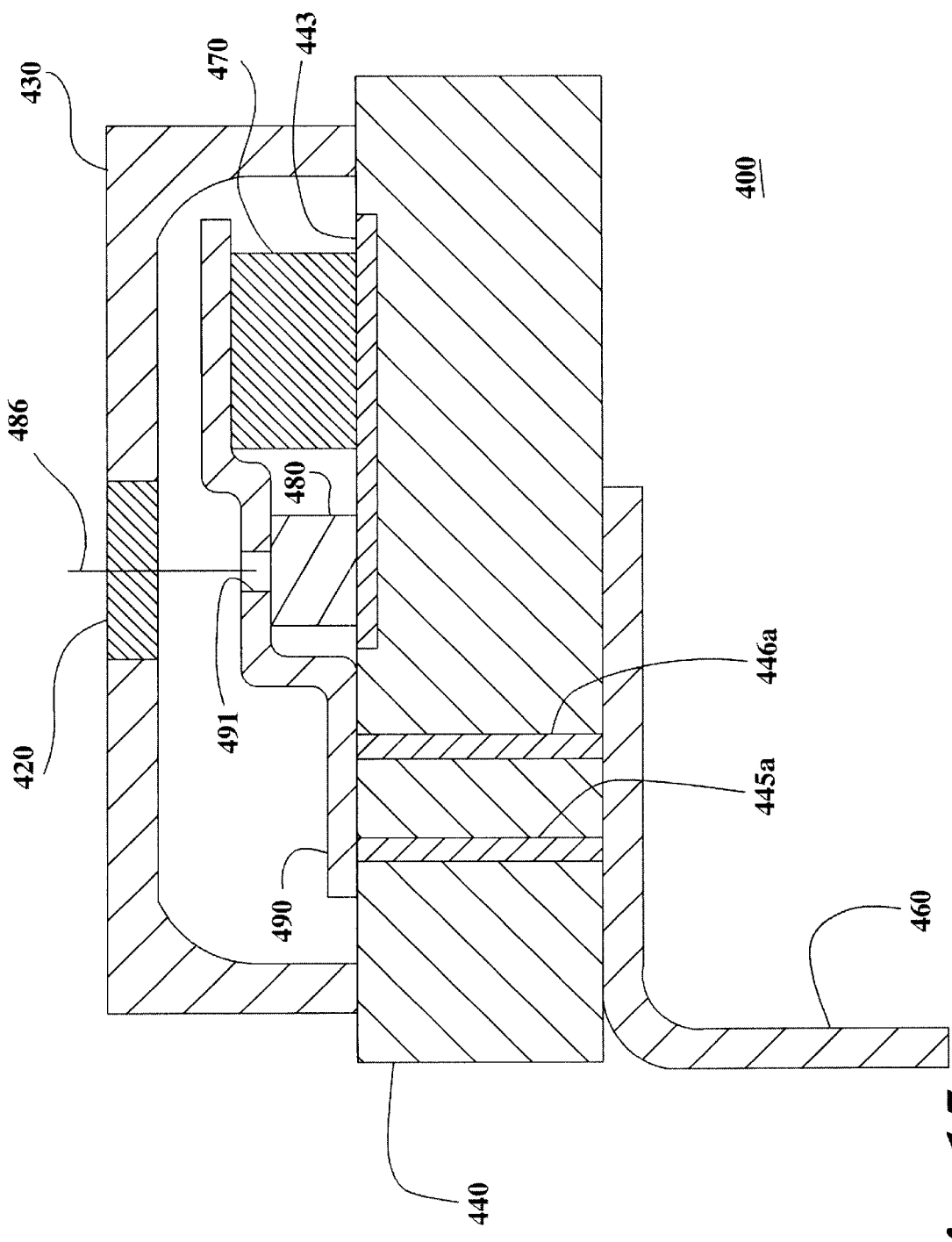
FIG. 15 is a cross-sectional view of the optoelectronic package of FIG. 13.

A second embodiment of the invention is shown in FIGS. 13–15. FIG. 13 is a perspective view of the optoelectronic package or device 400 which shows a transparent element 420 mounted in an electrically conductive can 430, where the electrically conductive can 430 is mounted on and hermetically sealed to an electrically conductive plating adhered to a non-electrically conductive substrate 440. Attached to the non-electrically conductive substrate 440 is a flex connector 460. An optical axis 486 is shown projecting through the transparent element 420. The can 430 is constructed similarly to the can 330 of the first embodiment.

FIG. 14 is an exploded perspective view of the device 400 shown in FIG. 13. The electrically conductive can 430 has a first aperture 432. The transparent element 420 is mounted on and hermetically sealed to the first aperture 432. The non-electrically conductive substrate 440 has a first surface 447 and a second surface 448 separated by a thickness as identified along edge 449. The first surface 447 is divided into three regions. The regions include a first region 443, a second region 442, and a third region 441. The first region 443 is separated from the third region 441 by the second region 442. The first region 443 is bound by line 403. The second region 442 is bound by lines 403 and 404. The third region 441 is bound by lines 404 and 405.

The non-electrically conductive substrate 440 includes three through-holes. The three through-holes include a first through-hole (not shown), a second through-hole 446, and a third through-hole 445. An electrically conductive plating or coating is adhered to the first surface 447 of the non-electrically conductive substrate 440 in the first region 443 and in the third region 441. Furthermore, the first, second, and third through-holes 444, 446, 445, are filled with the electrically conductive material so as to form first, second, and third conductive vias 444a (not shown), 446a, and 445a, respectively, which hermetically seal the through-holes.

The can 430 is hermetically sealed to the conductive plating adhered to the third region 441 along a second aperture 434 of the can 430. The flex connector 460 has conductive traces 462, 463, and 464. Conductive trace 462 is electrically connected to conductive via 445a, conductive trace 464 is electrically connected to conductive via 444a (not shown), and conductive trace 463 is electrically connected to conductive via 446a. The optical diode 480 and the monitor diode 470 are electrically connected to the electrically conductive plating adhered to the third region 443.

A second flex connector 490 has two conductive traces (not shown). The first conductive trace of the second flex connector 490 electrically connects the third conductive via to the optical diode 480. The second conductive trace of the second flex connector 490 electrically connects the second conductive via 446a to the monitor diode 470. The second flex connector 490 can be mounted to the vias and the diodes by way of a conductive epoxy or solder. The second flex connector 490 has an aperture 491 through which the optical axis 486 passes.

FIG. 15 is a cross-sectional view of the device 400 taken along section line 15—15 as shown in FIG. 13. Please note that the section line 15—15 does jog so as to cut through vias 445a and 446a, however, the section line 15—15 does not jog so as to cut through via 444a. The second flex connector 490 allows for a small profile or height of the can 430 which provides for a small profile device 400 as shown in FIGS. 13–15. The use of the second flex connector 490 eliminates the need to accommodate the space necessary for the service loop of the wire bond connectors 90, 91 as shown in FIG. 3. Furthermore, circuitry can be placed on the second flex connector 490 so as to control the impedance of the connection.

Figure 16:
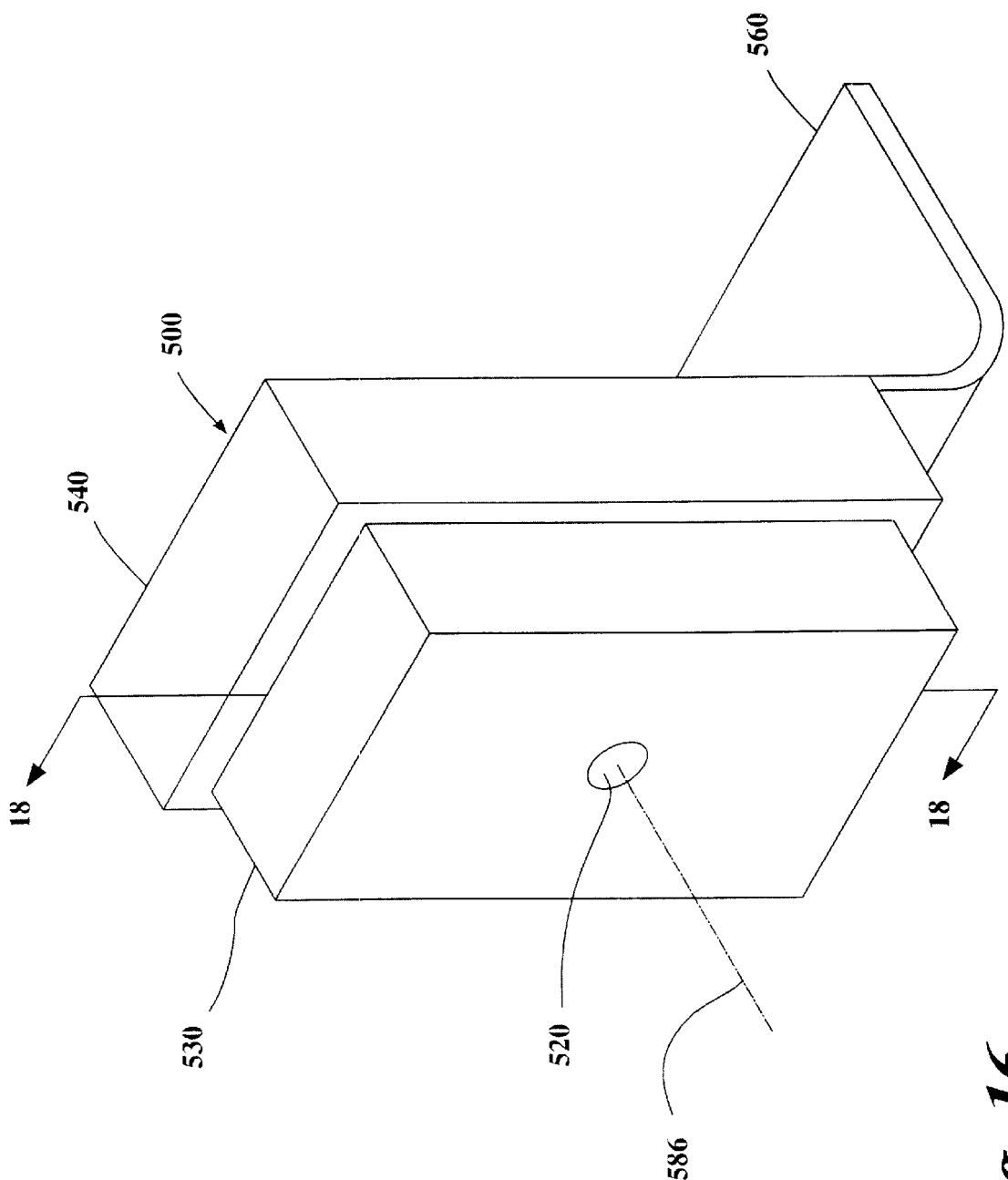
FIG. 16 is a perspective view of yet another optoelectronic package.
Figure 17:
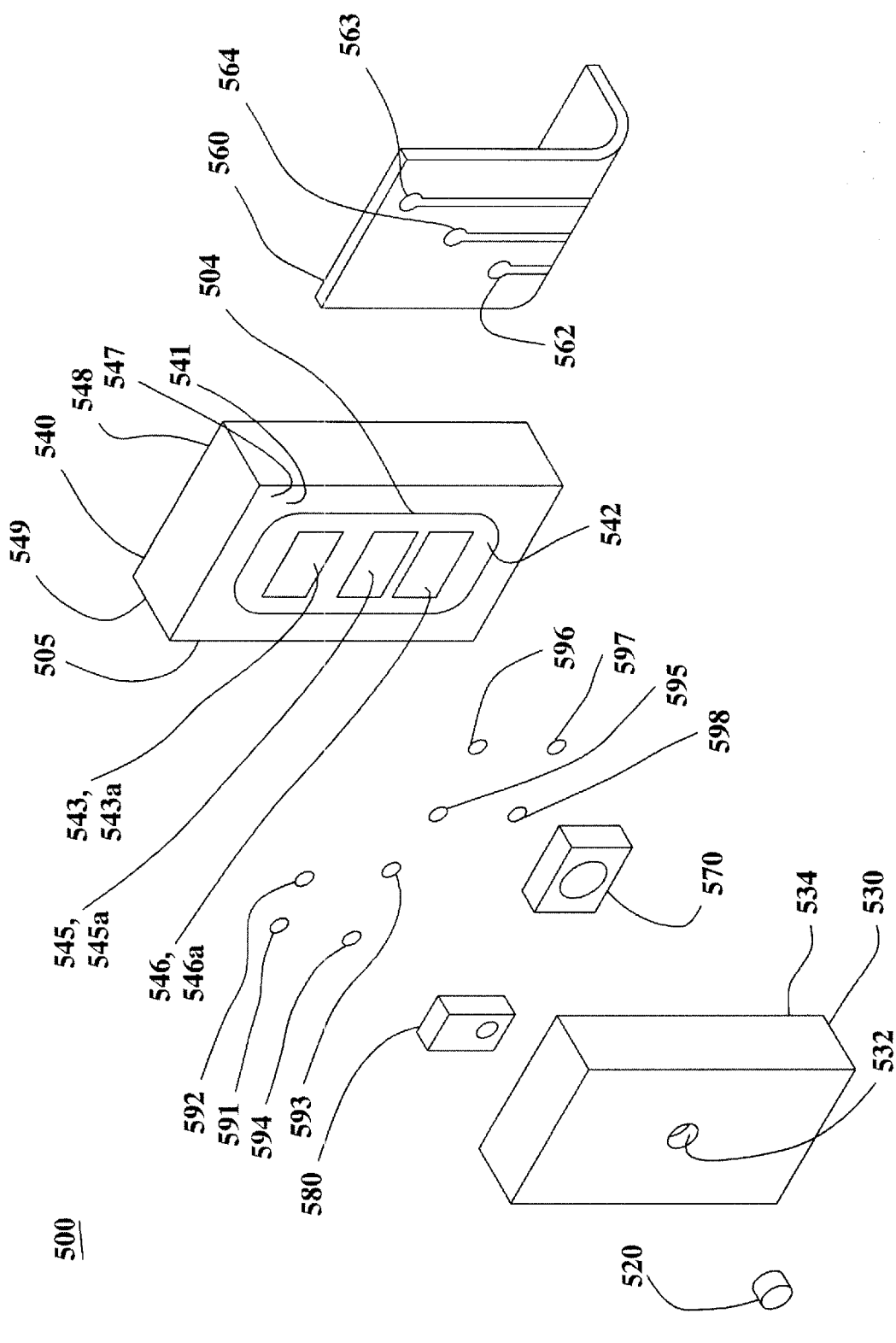
FIG. 17 is an exploded perspective view of the optoelectronic package of FIG. 16.
Figure 18:
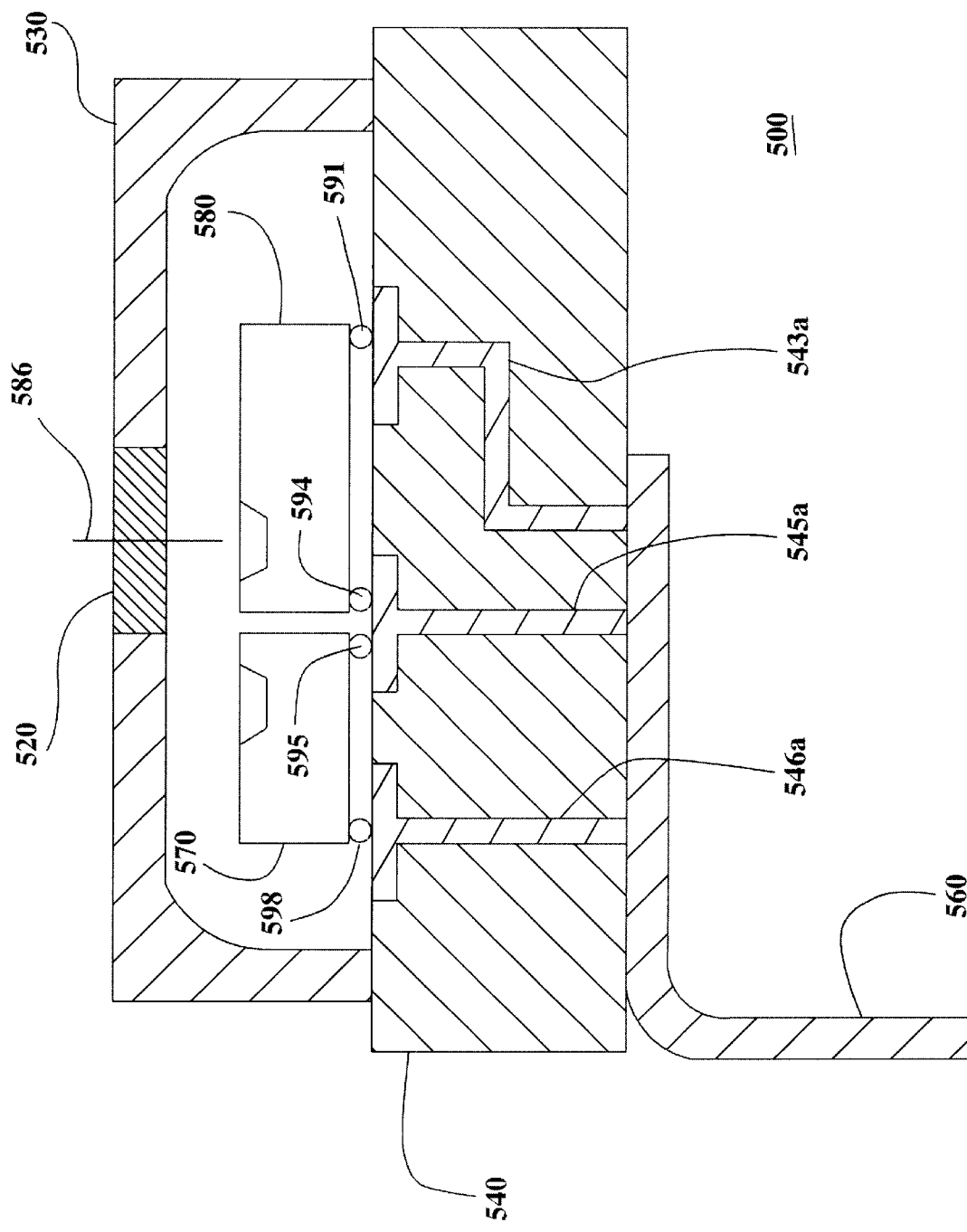
FIG. 18 is a cross-sectional view of the optoelectronic package of FIG. 16.

A third embodiment of the invention is shown in FIGS. 16–18. FIG. 16 is a perspective view of the optoelectronic package or device 500 which shows a transparent element 520 mounted in an electrically conductive can 530, where the electrically conductive can 530 is mounted on and hermetically sealed to an electrically conductive plating adhered to a non-electrically conductive substrate 540. Attached to the non-electrically conductive substrate 540 is a flex connector 560. An optical axis 586 is shown projecting through the transparent element 520. An optical signal is emitted by an optical diode 580. The optical signal travels in a direction of the optical axis 586. The can 530 is constructed similarly to the can 330 of the first embodiment.

FIG. 17 is an exploded perspective view of the device 500 shown in FIG. 16. The electrically conductive can 530 has a first aperture 532. The transparent element 520 is mounted on and hermetically sealed to the first aperture 532. The non-electrically conductive substrate 540 has a first surface 547 and a second surface 548 separated by a thickness as identified along edge 549. The first surface 547 is divided into two regions. The regions include a first region 541 and a second region 542. The first region 541 is bound by lines 505 and 504. The second region is bound by line 504.

The non-electrically conductive substrate 540 includes three through-holes. The three through-holes include a first through hole 543, a second through-hole 545, and a third through-hole 546. An electrically conductive plating or coating is adhered to the first surface 547 of the non-electrically conductive substrate 540 in the first region 541. Furthermore, the first, second, and third through-holes 543, 545, 546, are filled with the electrically conductive material so as to form first, second, and third conductive vias 543a, 545a, and 546a, respectively, which hermetically seal the through-holes.

The can 530 is hermetically sealed to the conductive plating adhered to first region 541 along a second aperture 534 of the can 530. The flex connector 560 has conductive traces 562, 563, 564. Conductive trace 562 is electrically connected to conductive via 546a, conductive trace 564 is electrically connected to conductive via 545a, and conductive trace 563 is electrically connected to conductive via 543a.

In this embodiment, the monitor diode 570 and the optical diode 580 are "flip-chip" designs where the diodes 570, 580 have their leads or contact positioned on only one side of the respective diode which are opposite to the optical signal reception or transmission side of the diodes. Such a photo diode is disclosed in U.S. Pat. No. 6,005,276 which is hereby incorporated herein by reference. The contacts are then electrically connected to the conductive vias by way of solder balls. The solder balls are reflowed and an attachment is made between the vias and the diodes. Solder balls or bumps are disclosed in U.S. Pat. No. 5,909,524 which is hereby incorporated herein by reference. Such an arrangement provides for a low profile since the wire bonds are eliminated.

The monitor diode 570 has a first lead or contact which is electrically connected to the third conductive via 546a by way of solder balls 597, 598. The monitor diode 570 has a second lead or contact which is electrically connected to the second conductive via 545a by way of solder balls 595, 596. The optical emitting or receiving diode 580 has a first lead or contact which is electrically connected to the second via 546a by way of solder balls 593, 594. The optical diode 580 has a second lead or contact which is electrically connected to the first conductive via 543a by way of solder balls 591, 592.

FIG. 18 is a cross-sectional view of the device 500 taken along section line 18—18 as shown in FIG. 16. Note that through-hole 543 and via 543*a* has a series of bends as it makes its way through the substrate.

Figure 19:
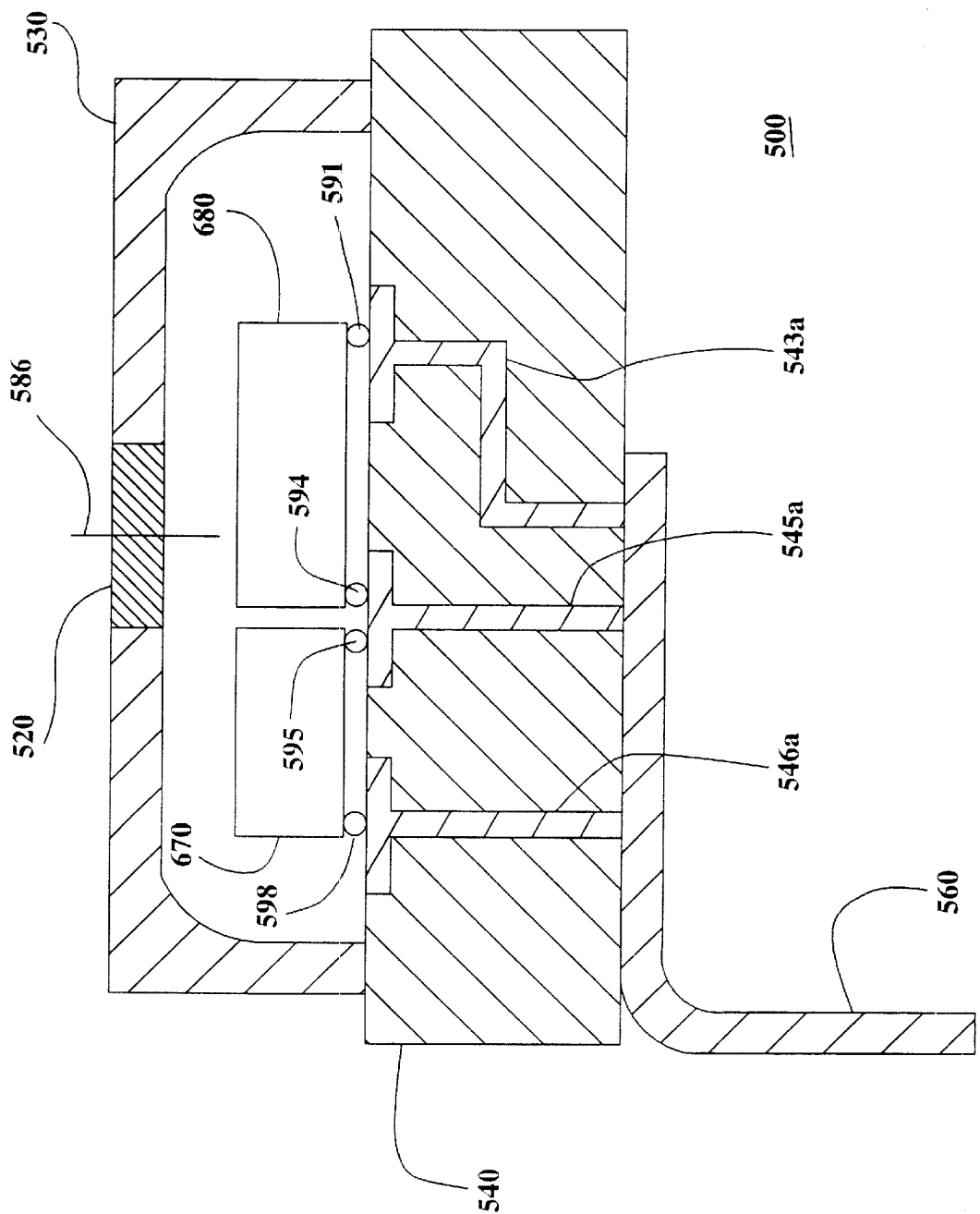
FIG. 19 is a cross-sectional view of an optoelectronic package which is similar to the package shown in FIG. 18.

FIG. 19 is a cross-sectional view of a device similar to that shown in FIG. 18. In one embodiment, element 670 is an amplifier and element 680 is a photodiode dector such as a PIN. In another embodiment, element 670 is a back illuminated photodiode and element 680 is a VCSEL.

Throughout the various versions and embodiment, similar materials and methods of construction are used throughout for the numerous components, unless otherwise stated.

Furthermore, the invention can be practiced without the use of the monitor diode, as such one of the electrically conductive vias would be eliminated.

The invention can also be used in a device similar to that described above where the package does not include a monitor diode and its associated conductor and via.

In another embodiment, the holder and the electrically conductive can are made of a non-magnetic material such as a 300 series stainless steel. A can made of such a stainless steel material would have a thermally matched window material. Such a window material includes a thermally matched borosilicate glass. Elan Technology of Midway, Georgia, sells a thermally matched borosilicate glass material under the tradename ELAN #46.

In still yet another embodiment, a laser driver circuit, a PIN diode amplifier, or other signal conditioning electronic components are placed within the space defined by the non-electrically conductive substrate, the transparent element, and the electrically conductive can.

Obviously, numerous modifications and variations of the present invention are possible in light of the above teachings. For example, the optical diode may be a detector photo diode or a laser such as a vertical cavity surface emitting laser (VCSEL) or a Fabry Perot device or a light emitting diode. Therefore, the present invention may provide a transmitting optical subassembly (TOSA) or a receiving optical subassembly (ROSA). It is therefore to be understood that within the scope of the appended claims, the invention may be practiced otherwise than as specifically described herein.

What is claimed is:

1. A hermetically sealed optoelectronic device comprising:
    a non-electrically conductive substrate having a first region, a second region, and a third region, the first region having a through-hole, the second region having a through-hole, and the first region being at a different elevation than the second region;
    an electrically conductive plating substantially covering the third region;
    an electrically conductive material substantially filling the through-hole of the first region so as to form a first electrically conductive via which also forms a hermetic seal, and the electrically conductive material substantially filling the through-hole of the second region so as to form a second electrically conductive via which also forms a hermetic seal;
    an optical diode having a first lead and a second lead, the first lead of the optical diode electrically connected to the first electrically conductive via, and the second lead of the optical diode electrically connected to tire second electrically conductive via, the optical diode having a surface, and the surface of the optical diode being substantially coplanar with the second region of the non-electrically conductive substrate, and the optical diode having an optical axis;
    an electrically conductive can having a first aperture and a second aperture; and
    a transparent element mounted on and hermetically sealed to the first aperture of the electrically conductive can, and wherein
        the second aperture of the electrically conductive can is mounted on and sealed to the electrically conductive plating adhered to the third region of the non-electrically conductive substrate so as to hermetically seal the optical diode between the non-electrically conductive substrate and the electrically conductive can from an ambient atmosphere whereby the optical diode is protected from the ambient atmosphere and environmental contaminants so as to ensure the integrity of a transmitted data signal, and wherein
        the optical axis of the optical diode passes through the transparent element.

2. The device according to claim 1 wherein the non-electrically conductive substrate has a rectangular shape.

3. The device according to claim 1 wherein the electrically conductive can comprises a material selected from the group consisting of a machined metallic material, a sintered metallic powder, and a non-magnetic material.

4. The device according to claim 1 wherein the transparent element comprises a borosilicate glass material.

5. A hermetically sealed optoelectronic device comprising:
    a non-electrically conductive substrate having a first region and a second region, the first region having a first through-hole, and the first region having a second through-hole;
    an electrically conductive plating substantially covering the second region;
    an electrically conductive material substantially filling the first through-hole so as to form a first electrically conductive via which also forms a hermetic seal, and the electrically conductive material substantially filling the second through-hole so as to form a second electrically conductive via which also forms a hermetic seal;
    an optical diode having a first lead and a second lead, the first lead of the optical diode electrically connected to the first electrically conductive via, and the optical diode having an optical axis;
    a flex connector having a conductive trace, the conducive trace of the flex connector electrically connecting the second lead of the optical diode to the second electrically conductive via;
    an electrically conductive can having a first aperture and a second aperture; and
    a transparent element mounted on and hermetically sealed to the first aperture of the electrically conductive can, and wherein
        the second aperture of the electrically conductive can is mounted on and sealed to the electrically conductive plating adhered to the second region of the non-electrically conductive substrate so as to hermetically seal the optical diode between the non-electrically conductive substrate and the electrically conductive can from an ambient atmosphere whereby the optical diode is protected from the ambient atmosphere and environmental contaminants so as to ensure the integrity of a transmitted data signal, and wherein
        the optical axis of the optical diode passes through the transparent element.

6. The device according to claim 5 wherein the non-electrically conductive substrate has a rectangular shape.

7. The device according to claim 5 wherein the electrically conductive can comprises a material selected from the group consisting of a machined metallic material, a sintered metallic powder, and a non-magnetic material.

8. The device according to claim 5 wherein the optical diode emits an optical signal along the optical axis, and wherein the flex connector has a third aperture so as to allow the optical signal emitted along the optical axis to pass therethrough.

9. The device according to claim 5 wherein the transparent element comprises a borosilicate glass material.

10. A hermetically sealed optoelectronic device comprising:
- a non-electrically conductive substrate having a first region and a second region, the first region having a first through-hole, and the first region having a second through-hole;
- an electrically conductive plating substantially covering the second region;
- an electrically conductive material substantially filling the first through-hole so as to form a first electrically conductive via which also forms a hermetic seal, and the electrically conductive material substantially filling the second through-hole so as to form a second electrically conductive via which also forms a hermetic seal;
- an optical diode having a first lead and a second lead, the first lead of the optical diode electrically connected to the first electrically conductive via, and the second lead of the optical diode electrically connected to the second electrically conductive via, and wherein the optical diode is a flip-chip optical diode, and the optical diode having an optical axis;
- an electrically conductive can having a first aperture and a second aperture; and
- a transparent element mounted on and hermetically sealed to the first aperture of the electrically conductive can, and wherein
  - the second aperture of the electrically conductive can is mounted on and sealed to the electrically conductive plating adhered to the second region of the non-electrically conductive substrate so as to hermetically seal the optical diode between the non-electrically conductive substrate and the electrically conductive can from an ambient atmosphere whereby the optical diode is protected from the ambient atmosphere and environmental contaminants so as to ensure the integrity of a transmitted data signal, and wherein
  - the optical axis of the optical diode passes through the transparent element, and wherein
- the optical diode is a flip-chip optical diode.

11. The device according to claim 10 wherein the non-electrically conductive substrate has a rectangular shape.

12. The device according to claim 10 wherein the electrically conductive can comprises a material selected from the group consisting of a machined metallic material, a sintered metallic powder, and a non-magnetic material.

13. The device according to claim 10 further comprising a first solder ball electrically connecting the first lead of the optical diode to the first electrically conductive via, and further comprising a second solder ball electrically connecting the second lead of the optical diode to the second electrically conductive via.

14. The device according to claim 10 wherein the transparent element comprises a borosilicate glass material.

* * * * *